United States Patent [19]
Young

[11] Patent Number: 4,461,000
[45] Date of Patent: Jul. 17, 1984

[54] ROM/PLA STRUCTURE AND METHOD OF TESTING

[75] Inventor: William R. Young, Palm Bay, Fla.

[73] Assignee: Harris Corporation, Melbourne, Fla.

[21] Appl. No.: 353,604

[22] Filed: Mar. 1, 1982

[51] Int. Cl.$^3$ ............................................. G01R 31/28
[52] U.S. Cl. ..................................... 371/21; 324/73 R
[58] Field of Search ................. 324/73 R; 371/21, 15; 364/716; 307/465

[56] References Cited

U.S. PATENT DOCUMENTS

| | | | |
|---|---|---|---|
| 3,958,110 | 5/1976 | Hong et al. | 371/15 |
| 3,982,111 | 9/1976 | Lerner et al. | 371/21 |
| 3,987,287 | 10/1976 | Cox et al. | 364/716 X |
| 4,024,386 | 5/1977 | Caudel et al. | 371/21 |
| 4,055,754 | 10/1977 | Chesley | 371/21 |
| 4,124,899 | 11/1978 | Birkner et al. | 364/716 X |
| 4,140,967 | 2/1979 | Balasubramanian et al. | 324/73 R |

OTHER PUBLICATIONS

Pilost, D., et al., "Latched Inputs-An Improvement to PLA," *IBM Technical Disclosure Bulletin*, vol. 20, No. 11A, Apr. 1978, 4438-4439.

*Primary Examiner*—Charles E. Atkinson
*Assistant Examiner*—Clark A. Jablon
*Attorney, Agent, or Firm*—Barnes & Thornburg

[57] ABSTRACT

An improved integrated ROM/PLA structure which is capable of simultaneous PLA and ROM addressing substantially reduces the number of tests needed to verify the complete structure. The OR gate matrix and the ROM addressing mode of the AND gate matrix are verified using the ROM addressing mode. The PLA addressing mode is tested by the simultaneously using the ROM and PLA addressing modes to individually activate the AND gates. The AND gates are then tested with the DON'T CARE address lines at a first state and then a second logic state. The test sequence then includes complementing the CARE lines one at a time.

The ROM/PLA structure is also improved to include two input structures providing parallel inputs to the OR matrix and dedicated first and second ROM portions of the OR matrix. The output logic is modified so as to merge the literal from the input macroinstruction into the output microinstruction. Similarly, an improved next address logic is provided such that the next address is a function of the output of the OR gate, the microinstruction input, the current computer status and test word input.

32 Claims, 7 Drawing Figures

ROM/PLA STRUCTURE AND METHOD OF TESTING

BACKGROUND OF THE INVENTION

The present invention relates generally to programmable logic arrays and more specifically to an improved programmable logic array and method of testing.

Logic arrays have been used extensively as decoders, for example, to convert or decode a macroinstruction into a microinstruction. The first type of decoder which was used was a read-only memory (ROM) which was followed by programmable logic arrays (PLA). The ROM and PLA both include an AND matrix and an OR matrix wherein the AND matrix is the input decoder for the OR matrix. The ROM uses all of its input to the AND matrix to uniquely decode each term or output of the AND matrix so as to provide a single input to the OR matrix. In contrast thereto, the PLA uses any or all of its inputs to the AND matrix to allow one or more of the terms in the AND matrix to be decoded so as to provide one or more inputs to the OR matrix. The advantages and disadvantages of the ROM's and PLA's are well known and will not be described herein.

Attempts have been made to take advantage of the best features of the PLA and ROM structures. As illustrated in FIG. 1, the macroinstruction is inputed into the PLA which is the input structure and provides an output as a microinstruction or as the next address input to a ROM which may also provide an output microinstruction. The output logic selects between PLA output and ROM output. The concept of FIG. 1 has been further refined as illustrated in FIG. 2 wherein the AND gate and OR gate of the PLA and ROM are integrated. As illustrated in FIG. 3, the AND gate matrix includes a plurality of AND gates having ROM and PLA inputs. The OR gates of the OR matrix are selectively connected to the AND gates of the AND matrix so as to be selectively addressed by the AND gates in a ROM or PLA addressing mode.

The integration of the ROM and PLA structure has provided a very powerful decoder, but has also provided a structure which is very time consuming to test. For a combined ROM/PLA structure having 56 inputs, 8 of which are ROM inputs and 48 of which are PLA inputs would require approximately $2^{48}$ or $10^{14}$ tests. Thus, it can be seen that if the integrity of the combined ROM/PLA structure is to be verified, a new method of testing and accompanying structure must be devised.

SUMMARY OF THE INVENTION

An object of the present invention is to provide an integrated ROM/PLA structure which may be tested with a reasonable number of test sequences.

Another object of the present invention is to provide a combined ROM/PLA structure which is capable of merging the literal from the input macroinstruction into the output microinstruction.

A further object of the present invention is to provide a combined ROM/PLA structure which is readily laid out as an integrated circuit.

A still further object of the present invention is to provide an improved geometry ROM/PLA structure by using multiple groups of PLA inputs.

Still an even further object of the present invention is to provide a ROM/PLA structure wherein the next address is a function of the output of the OR array, macroinstruction input, current computer status and test word.

These and other objects of the invention are attained by providing a latch at the ROM input to the AND matrix such that the AND matrix is capable of operating simultaneously in a PLA and ROM addressing mode. This allows for individual selection of AND gates during PLA mode addressing. The test sequence begins with verifying the OR gate matrix and the ROM addressing mode of the AND gate matrix. Each AND gate of the AND matrix is individually activated using ROM addressing mode to select in combination with the OR gate matrix individual OR gates to verify their logic state. Once the ROM addressing mode of the AND gate matrix and the total OR gate matrix have been verified, the PLA addressing of the AND gate is verified. This second testing sequence includes providing a PLA and ROM address which uniquely selects a single AND gate in the AND gate matrix with DON'T CARE PLA addresses at a first logic state and then at a second logic state. The output of the OR gate matrix is monitored for both DON'T CARE logic states to insure that the expected OR gate output is generated. Next, each of the CARE lines or bits of the PLA address are complemented one at a time and the output of the OR matrix is monitored for each complemented CARE address line to insure that a unique OR gate output which represents no selected OR term is generated. This second sequence is repeated for each PLA term or AND gate.

In order to make the ROM/PLA structure readily integrated on a chip, the AND gate matrix includes two PLA input structures providing parallel inputs to the OR matrix. The OR matrix includes groups of columns dedicated to ROM and first and second PLA inputs.

Output logic is provided so as to control the output of the OR gate matrix in combination with control of the input to the AND gate matrix such that the appropriate information may be addressed. A bypass is provided between the input to the ROM/PLA structure to the output of the OR gate matrix and control logic is provided at the output of the OR gate matrix such that the input to the ROM/PLA structure may be mixed with the output of the OR gate matrix as a function of the output of the OR gate matrix.

The next address logic, normally connected between the output of the OR gate matrix and the input of the AND gate matrix, provides a next address to the AND gate matrix as a function of the macroinstruction, the output of the OR gate matrix, computer status and test words.

Other objects, advantages and novel features of the present invention will become apparent from the following detailed description of the present invention when considered in conjunction with the accompanying drawings.

DESCRIPTION OF THE PREFERRED EMBODIMENTS

Figure 1:
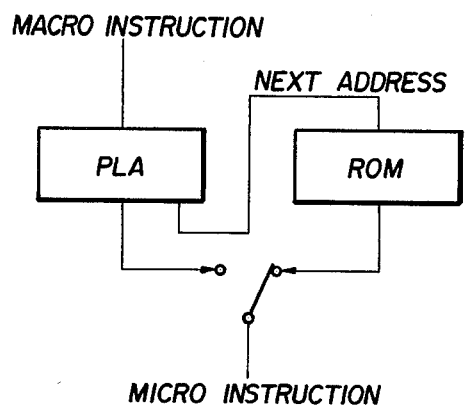
FIG. 1 is a block diagram of a system of a prior art incorporating a PLA and ROM structure.

The structure of the present invention is a logic array having an AND gate matrix and an OR gate matrix. The use of the terms ROM and PLA as used in the specification and the claims are directed to specific techniques of addressing and not to ROM and PLA structures specifically. ROM or ROM addressing is a technique of addressing wherein all of the ROM input lines are used in the AND gate matrix to decode uniquely a single AND gate to provide a single input to the OR gate matrix. The PLA addressing technique uses one or more of the PLA input lines to one or more AND gates to provide one or more inputs to the OR gate matrix. The specific structure of the AND gate matrix and OR gate matrix may be those within the skill of the artisan. They may be considered read-only memories (ROM), programmable read-only memories (PROM), electrically alterable read-only memories (EAROM), or the equivalent. Similarly, the structure may be considered a programmable logic array (PLA), a field programmable logic array (FPLA), field programmable gate arrays (FPGA), field programmable logic systems (FPLS), a programmable array logic (PAL) or the equivalent.

Before describing the present invention in detail, the prior art system of FIG. 2 will be described. The integrated ROM/PLA structure of FIG. 2 includes an AND matrix 10, an OR matrix 12, next address logic 14 and control logic 16. The input to the logic array at 18 is illustrated as a macroinstruction, This input is connected to the next address logic 14, control logic 16, and PLA OR gate 20. The output of the next address logic 14 is the NEXT ADDRESS and is provided as an input to PLA OR gate 22 and ROM OR gate 24. The NEXT ADDRESS from the next address logic 14 is also connected to the control logic 16. A second input to PLA OR gates 20 and 22 is a $\overline{\text{PLA INPUT ENABLE}}$ from control logic 16. The other input to the ROM OR gate 24 is $\overline{\text{ROM INPUT ENABLE}}$ from the control logic 16. The OR gates 20, 22 and 24 provide input logic to the AND gate matrix 10 such that the ROM addressing mode uses the next address through OR gate 24 whereas the PLA addressing mode uses the macroinstruction via OR gate 20 and the NEXT ADDRESS via OR gate 22. The next address from the next address logic 14 may be a combination of the macroinstruction and the output of the OR gate matrix to be explained more fully below.

It should be noted that OR gates 20 and 22 represent one of a plurality of PLA OR gate inputs such that for twenty-four PLA input variables, sixteen of which are macroinstructions and eight are next address, there are sixteen and eight OR gates 20 and 22, respectively. Similarly, the ROM OR gate 24 represents one of, for example, eight ROM OR gates for eight ROM input lines.

Figure 3:
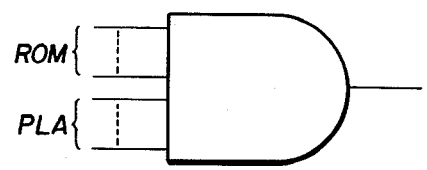
FIG. 3 is a block diagram of an AND gate of the AND matrix of FIG. 2.

The AND gate matrix 10 includes a plurality of AND gates, one of which is illustrated in FIG. 3. The AND gate includes ROM inputs one for each of the ROM input lines which for the present example is eight and one or more PLA lines. The number of PLA lines connected to each of the individual AND gates is a function of the product term of the logic array. Thus, for ROM addressing mode of the AND matrix, all the PLA lines must be high. This is accomplished by the $\overline{\text{PLA INPUT ENABLE}}$ to the OR gates 20 and 22. Similarly, during the PLA addressing mode of the AND gate matrix, all the ROM input lines to the AND gates must be high. This is accomplished by the $\overline{\text{ROM INPUT ENABLE}}$ input to ROM OR gate 24.

The output of the OR gate matrix 12 is connected to ROM gate output AND 26 and PLA output AND 28. The other input to ROM output AND 26 is ROM OUTPUT ENABLE from the control logic 16 and the other input to PLA output AND 28 is a PLA OUTPUT ENABLE from control logic 16. OR gate 30 whose inputs are output which is illustrated as a microinstruction.

Also connected to the output of the OR gate matrix are next address ROM AND gate 34 and next address PLA AND gate 36. The other input to AND gates 34 and 36 are ROM OUTPUT ENABLE and PLA OUTPUT ENABLE, respectively, from control logic 16. The next address OR gate 38 having inputs from AND gates 34 and 36 provide a next address field to the next address logic 14. The AND gates 26, 28 and OR gate 30 represent one of a plurality of sets depending upon the size of the output word. Similarly, the AND gates 34 and 36 and OR gate 38 represent one of a plurality of sets depending upon the size of the next address field. The OR gate matrix 12 has a section of columns dedicated to ROM and a section of columns dedicated to PLA. Thus, the AND gates 26, 28, 34 and 36 provide control and selection of the appropriate section by the control logic 16 to be used as the output at terminal 32 and as the next address field to next address logic 14.

The computer status at input terminal 40 is connected to the next address logic 14 and the control logic 16.

Figure 2:
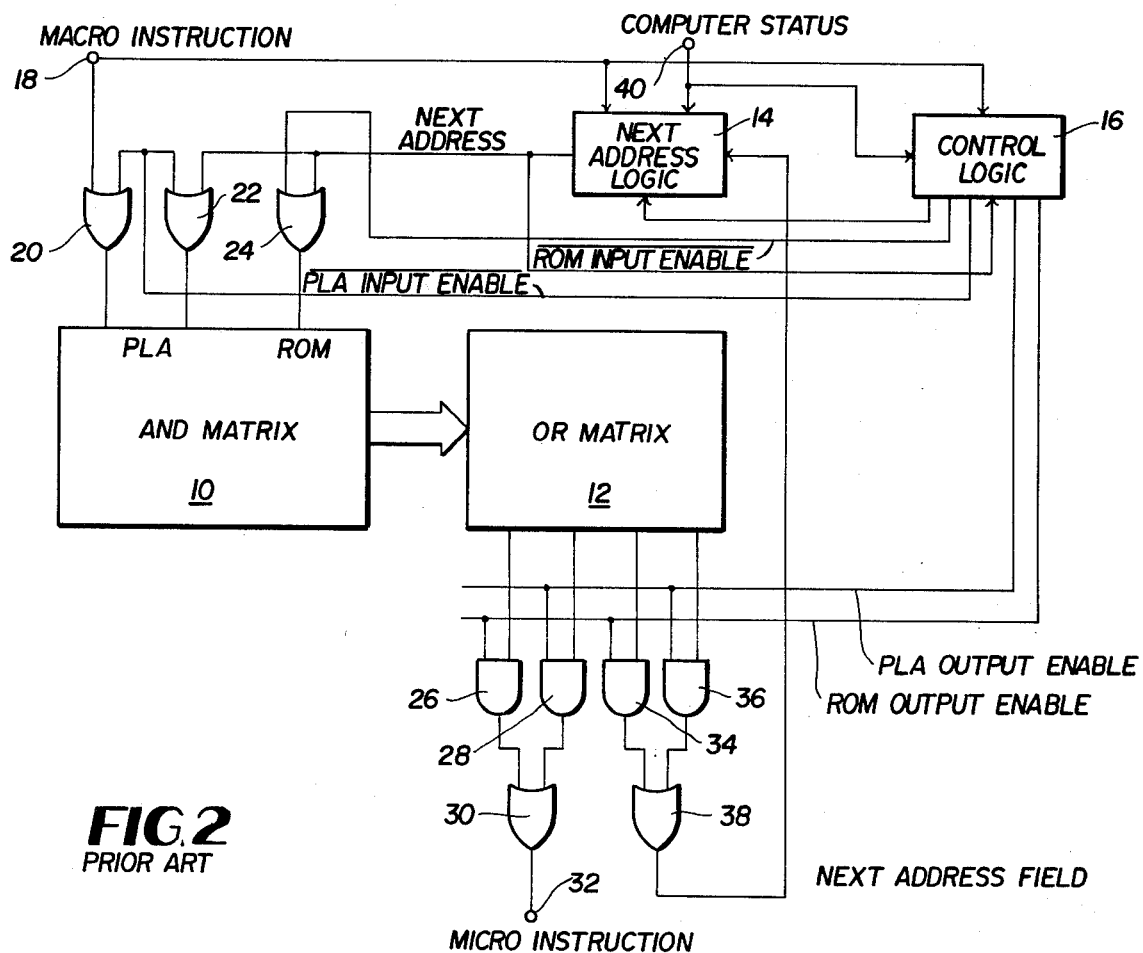
FIG. 2 is a block diagram of an integrated ROM/PLA structure of the prior art.
Figure 4:
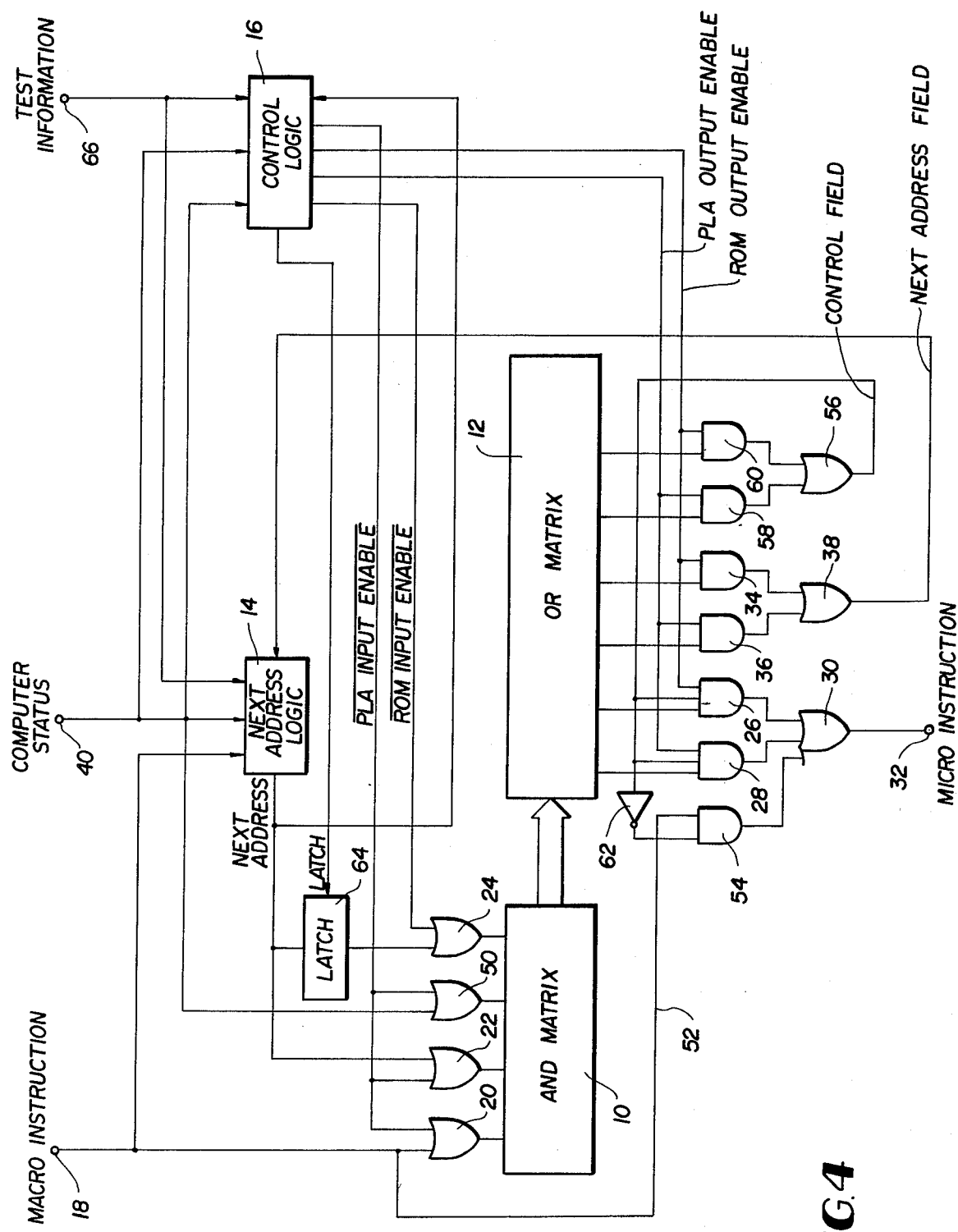
FIG. 4 is a block diagram of a ROM/PLA structure incorporating the principles of the present invention.

An improved ROM/PLA structure is illustrated in FIG. 4 and includes the basic elements of FIG. 2 with the common elements having the same number in FIG. 4 and FIG. 2. One of the improvements of FIG. 4 is the addition of OR gate 50 at the input of the AND gate matrix 10 having an input from computer status terminal 40 and an input from the $\overline{\text{PLA INPUT ENABLE}}$ from control logic 16. This additional PLA OR gate 50 allows PLA addressing of the OR matrix 12 as a function of computer status. For example, this would allow for direct addressing for an interrupt as well as other computer statuses.

Another improvement of the ROM/PLA structure of FIG. 4 is the capability of removing the literal from the macroinstruction input 18 and combining it with the output of the OR matrix 12 such that the microinstruction output 32 is a combination of the literal from the macroinstruction and the microinstruction from the OR gate matrix 12. This is accomplished by a bypass line 52 connected to the logic array input terminal 18 and AND gate 54. The output of AND gate 54 is connected as an additional input to the output OR gate 30 whose other inputs are from the ROM output AND 26 and the PLA output AND 28. The other input to bypass AND 54 is from a control field OR gate 56 whose inputs are from PLA AND gate 58 and ROM AND gate whose inputs are respectively connected to the PLA portion and the ROM portion of the OR matrix output. As with the other AND gates, the other input to PLA AND gate 58 and ROM AND gate 60 are from the PLA OUTPUT ENABLE and ROM OUTPUT ENABLE, respectively, from control logic 16. The number of sets of AND gates 58 and 60 and OR GATE 56 is a function of the number of bits in the control field.

The output of the control OR gate 56 is connected as additional inputs to ROM output AND 26 and PLA output AND gate 28. Inverter 62 connects the output of the control field OR gate 56 to the bypass AND gate 54. Thus, the control field OR gate 56 acts as an enable to the AND gates 26 and 28 in addition to the PLA output and ROM output enable signals and inversely enables the bypass AND gate 54. Thus, the output OR gate 30 will receive only one signal from AND gates 26, 28 and 54. Since AND gates 26, 28 and 54 and OR gate 30 represent one of a plurality of sets, only a portion of the input is provided as a portion of the output of the OR matrix. Thus, a literal of, for example, eight bits is used in a twenty-two bit output. The number of bits of the input used is determined by the control field from control field OR gate 56.

Another modification of the ROM/PLA structure of FIG. 3 is the addition of latch 64 between the output of the next address logic 14 and the input to ROM OR gate 24 of the AND gate matrix 10. The latch 64 is under the control of control logic 16. Test information at input terminal 66 is provided to the control logic 16 and to the next address logic 14. In standard operation of the logic array, latch 64 is controlled so as to provide an input to the ROM OR gate 24 in ROM addressing modes. Since the $\overline{\text{ROM INPUT ENABLE}}$ input to OR gate 24 is high for PLA addressing modes, the contents of latch 64 will have no effect of the PLA addressing mode. The additional feature added by the use of latch 64 is the capability of providing two distinctive next addresses to the ROM OR gate 24 through latch 64 and to PLA OR gate 22. The first next address is stored in latch 64 and the second next address is provided directly to PLA OR gate 22. Control logic will control latch 64 and the $\overline{\text{PLA INPUT ENABLE}}$ and $\overline{\text{ROM INPUT ENABLE}}$ such that the AND matrix may be controlled for simultaneous PLA and ROM addressing modes. The importance of this feature will become evident after a description of the test sequence which is capable because of the latch 64.

Figure 6:
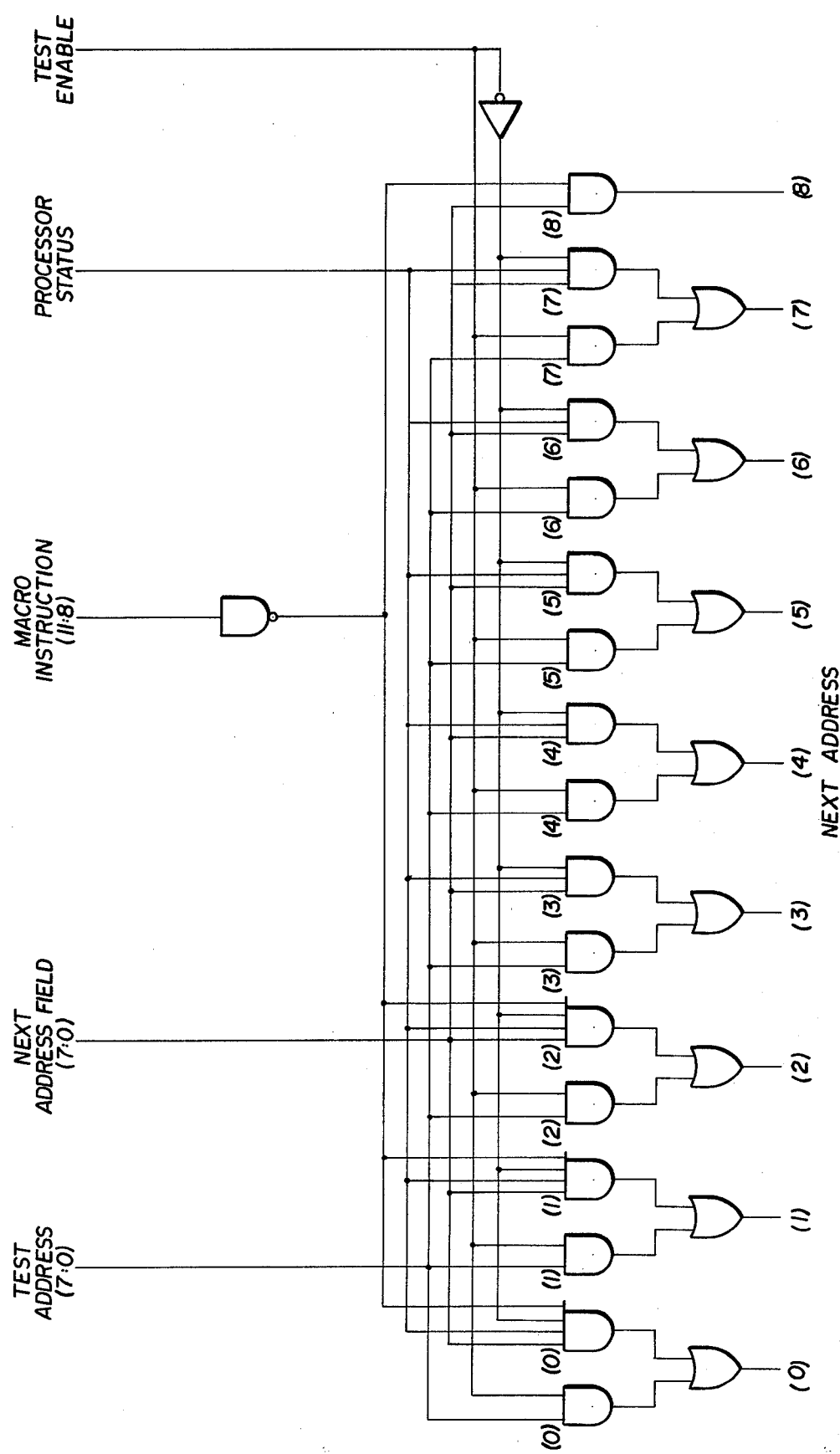
FIG. 6 is a diagram of the next address logic.
Figure 7:
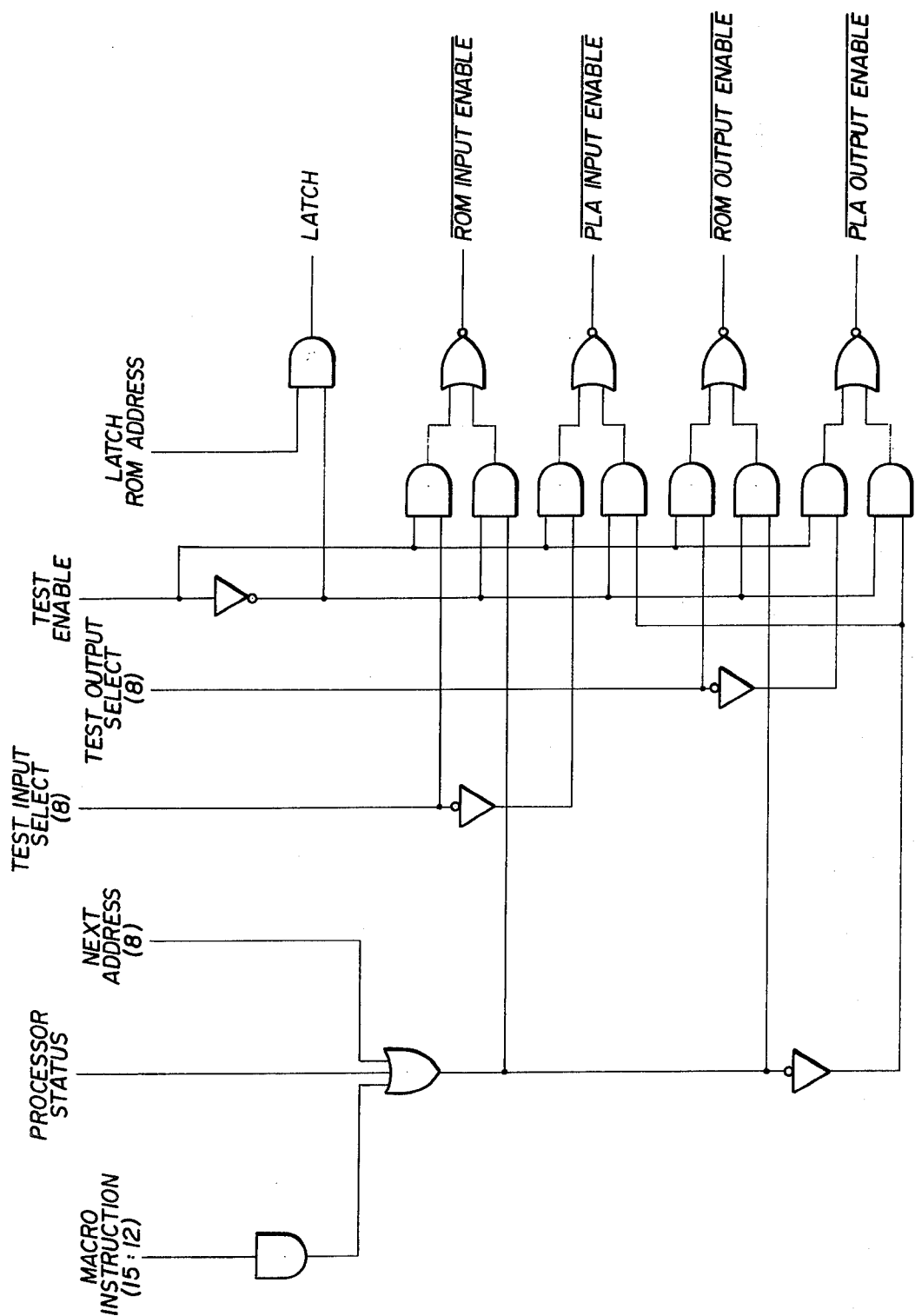
FIG. 7 is a diagram of the control logic.

The next address logic 14 and control logic 16 may be PLA's as in FIG. 2 with modification to accommodate the additional inputs and provide the additional outputs needed for the following test. An example of the next address logic 14 is illustrated in FIG. 6 and of the control logic 16 in FIG. 7.

The test of the present invention includes a first test sequence to test the OR gate matrix 12 using the ROM addressing mode of the AND gate matrix and a second sequence to test the AND gate matrix by using simultaneously the PLA and ROM addressing mode of the AND gate matrix. For purposes of comparison, the number of inputs for the ROM and PLA for FIG. 4 will be the same as that for FIG. 2, namely, eight ROM input variables and twenty-four PLA input variables.

The first test sequence includes addressing all of the 256 AND gates which are capable of being addressed by the eight ROM input lines. Since each of the AND gates are capable of addressing a single row of the OR gate matrix, the ROM and PLA sections of the OR gate matrix may be tested by controlling the output logic of AND gates 26 and 28 for a single AND gate selected by the ROM addressing mode. Thus, to verify the operation of the ROM addressing mode and the contents of each OR gate of the OR gate matrix 12, requires $2 \times 2^8 = 512$ tests.

Since the structure of each of the OR gates of the OR gate matrix 12 and the ROM addressing mode of the AND gate matrix 10 have been verified by the first test sequence, the second test sequence is to verify the PLA addressing mode of the AND gate matrix 10. The second test sequence includes providing a PLA address word to the PLA inputs with all the DON'T CARE address lines at a first logic state and providing an address via latch 64 to the ROM input so as to select one of the AND gates which is enabled by the PLA address word. Thus, the latch 64 allows the AND gate matrix to be simultaneously addressed in the ROM and PLA addressing modes using two different addresses. Without such capability, a single AND gate in the PLA mode may not be selected since a single input on the PLA lines to AND gate matrix provides a plurality of outputs from the AND gate matrix as a plurality of inputs to the OR gate matrix. Thus, the ability to select a single AND gate in the PLA addressing mode is critical.

The output of an OR gate matrix is monitored to verify appropriate PLA addressing with DON'T CARE address portions or lines at a first logic state. Next, the PLA address is changed wherein the DON't CARE portions of the address are complemented and the output of the OR matrix is again monitored to verify that there has been no change in its output.

The next segment of the second test sequence includes complementing each of the CARE address lines of the PLA address word one at a time and monitoring the OR gate matrix output to verify that there is no output. If there is an output, this would indicate that there is an error in the AND gate matrix for the PLA addressing mode since the ROM addressing had previously been verified in the first test sequence and therefore only one AND gate can be activated. This output error would indicate that less than all the desired lines of the PLA CARE address are connected to the AND gate since complementing that specific line did not change the output from the uncomplemented CARE address line output.

To further verify the PLA addressing mode, the output of the ROM section of the OR matrix may also be monitored during the CARE line complementing. Since the AND gate selected by the ROM input should not be activated for the complemented PLA address lines, no output should be present from the ROM section of the OR gate matrix.

For the worse case wherein twenty-three of the twenty-four variables are used as a term in a logic equation, this would require two tests of the CARE address at a first and then a second logic state and twenty-three complemented tests monitoring the PLA output section of the OR array. This would yield $23 + 2 = 25$ tests for each AND gate. Since all the AND gates should be tested using the same sequence, this would require $25 \times 256 = 6,400$ tests for the PLA addressing mode. Thus, the sum of the 512 tests for the first sequence which test the OR gate matrix and the ROM addressing mode and the 6,400 tests for the second test sequence which tests the PLA addressing mode is a total of 6,912 total tests. This is substantially smaller than the approximately $1.6 \times 10^7$ or 224 tests which would be required for FIG. 2.

Figure 5:
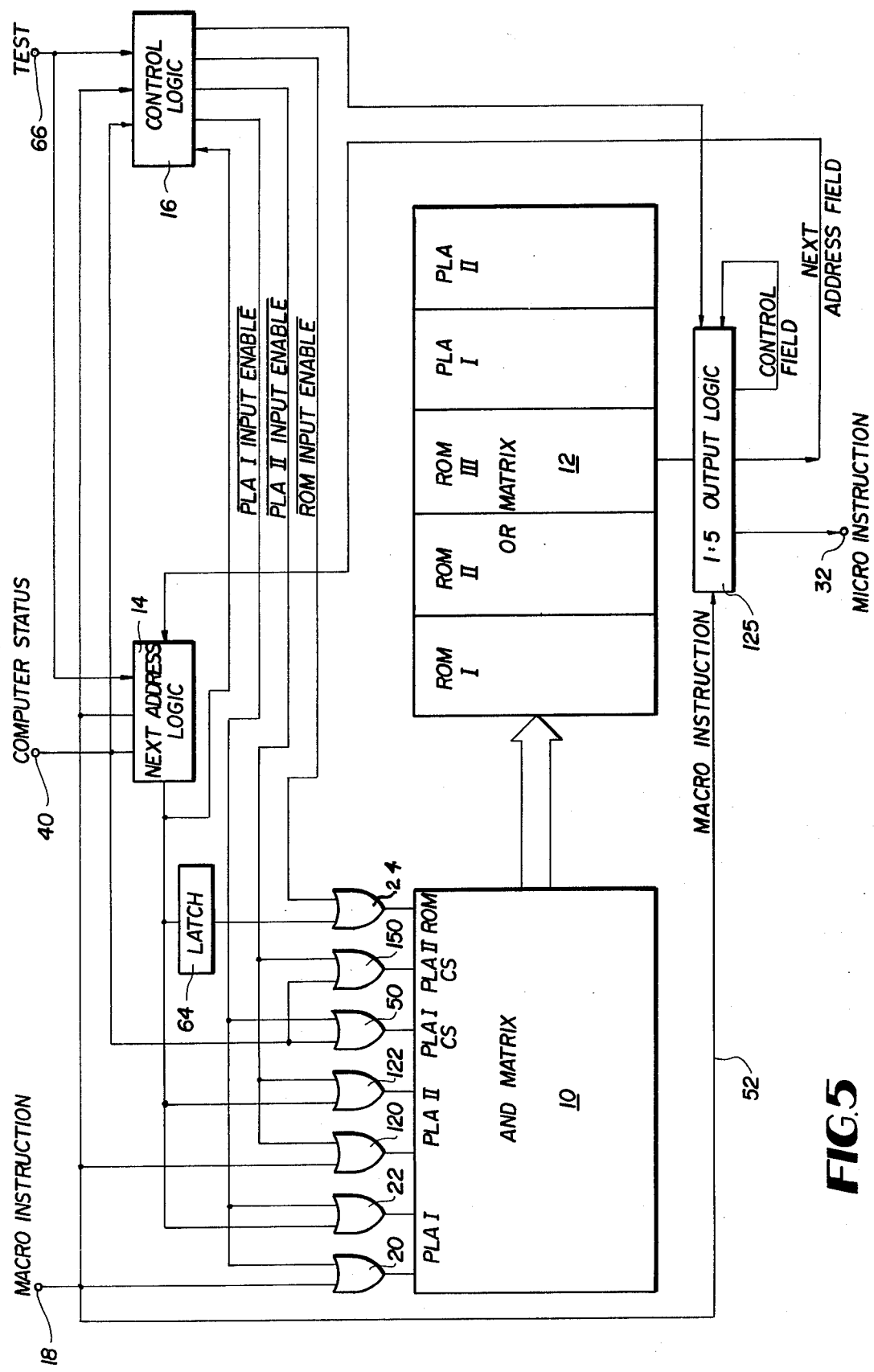
FIG. 5 is another embodiment of a ROM/PLA structure incorporating the principles of the present invention.

A further improvement on the system of FIG. 4 is illustrated in FIG. 5. The essence of the difference between FIGS. 4 and 5 is the addition of a second set of PLA OR gate inputs 120 and 122 equivalent to OR gate inputs 20 and 22. To be more specific, OR gate 120 is connected to the macroinstruction input 18 and OR gate 122 is connected to the next address logic 14. Control logic 16 is modified to provide a PLA-I INPUT ENABLE and a PLA-II INPUT ENABLE control signals for the PLA-I and PLA-II sets of OR gates. Since two PLA addressing modes or structures are provided for the AND gate matrix, the PLA computer status OR gate 50 is controlled by the PLA-I ENABLE and a second PLA computer status OR gate 150 is added and controlled by the PLA-II INPUT ENABLE.

The PLA-I and PLA-II input logic to the AND gate matrix are considered parallel inputs to the AND gate matrix and are provided to AND gates which icludes not only ROM inputs but inputs from PLA-I and PLA-II input structures as well as PLA computer status input structure. The twenty-four PLA variables of the previous example of FIG. 4 are duplicated as two twenty-four variables to each PLA-I and PLA-II. This design allows more versatility of the AND matrix.

If the number of terms required by the twenty-four PLA variables exceeds the number of AND gates required for the ROM input, additional AND gates would have to be provided and would be outside the control of the ROM inputs. This would make the AND matrix very long and narrow which is undesirable for circuit layout. Also by providing AND gates which are not under the control of the ROM inputs, the test sequence as described above cannot be performed since the second test sequence requires simultaneous addressing in the PLA and ROM addressing modes such that the ROM selects uniquely one AND gate at a time to test the PLA addressing structure. By providing dual PLA input structures, 512 terms may be provided using 256 AND gates for an eight line ROM input structure.

The OR gate matrix 12 has also been modified as illustrated by the lines to have a plurality of ROM sections and two PLA sections. Each of these sections represent a plurality of columns defining an output word. The output logic 125 is a one out of five multiplex structure including the basic logic of FIG. 4 illustrated by the AND gates 26, 28, 34, 36, 54, 58 and 60 and OR gates 30, 38 and 56. The output structure 125 provides the microinstruction at terminal 32, a next address field to the next address logic 14 and a control field back to itself. The output logic 125 selects the appropriate group of columns from the OR matrix to provide the appropriate output under the control of the control logic 16.

The test sequence is identical to that described for FIG. 4 except that instead of monitoring the output of the OR gate for two sections, the output is monitored for all five sections to test the OR matrix. Assuming as in the previous example that the computer status PLA is part of the twenty-four PLA variables, the structure of FIG. 5 also substantially reduces the number of tests from that of FIG. 2, namely, approximately $10^{14}$ using a testing technique other than the present invention. For example, using the dual parallel PLA input structure of FIG. 5 and testing each one uniquely would require $2^{24}$ which is approximately $1.6 \times 10^7$. Since both of them must be tested separately, this would require $3.2 \times 10^7$ tests under this structure.

Using the testing sequence described for FIG. 4 with the structure of FIG. 5, the test is reduced to 14,080. This results from 256 ROM addresses times the five sections or 1,280 tests to test the OR array and 25 worse case tests for each PLA$\times$2 PLA's$\times$256 AND gates which produces 12,800 tests. Thus, using the testing method of the present invention in FIG. 5 requires only 14,080 tests compared to the 32,000,000 tests of a FIG. 5 structure using previous testing methods. Thus, it can be seen that the structure of FIG. 5 provides more versatility than the structure of FIG. 4. Thus, the present invention has provided not only an improved integrated structure, but a method for verifying the structure which was not previously feasible.

From the following description of the preferred embodiments it is evident that the objects of the invention are attained. Although the invention has been described and illustrated in detail, it is clearly understood that the same is by way of example and illustration only and is not to be taken by way of limitation. The spirit and scope of the present invention are to be limited only by the terms of the appended claims.

What is claimed:

1. A method of testing a programmable-logic-array having an AND gate matrix and an OR gate matrix comprising:
   first testing said OR gate matrix to verify each OR gate individually; and
   second testing said AND gate matrix by individually addressing all of the AND gates and monitoring the output of said OR gate matrix.

2. The method of testing according to claim 1 including providing additional input lines to each of said AND gates so that said AND gates can be individually and uniquely addressed.

3. The method of testing according to claim 2 wherein said first test includes setting all of the programmable logic inputs to said AND gate matrix logic high and using said additional inputs to individually address said OR gates.

4. The method of testing according to claim 2 wherein said test includes providing an address on said programmable logic inputs and said additional inputs to uniquely address an AND gate with DON'T CARE programmable logic inputs at a first logic state and then at a second logic state, and monitoring said output of said OR gate matrix for both DON'T CARE logic states.

5. The method of testing according to claim 4 wherein said second test further includes for each AND gate complementing each CARE programmable logic input one at a time, and monitoring said output of said OR gate matrix for each complemented input.

6. A method of testing a programmable-logic-array having an AND gate matrix and an OR gate matrix comprising:
   first testing said OR gate matrix to vertify each OR gate individually; and
   second testing the AND gate of said AND gate matrix individually by uniquely addressing each AND gate with DONT'T CARE inputs at a first logic state and then at a second logic state, and monitoring the output of said OR gate matrix for both DON'T CARE logic states.

7. The method of testing according to claim 34 wherein said second test further includes for each AND gate complementing each CARE input one at a time, and monitoring said output of said OR matrix for each complemented input.

8. A method of testing a logic array having a programmable-logic-array and a read-only-memory addressing mode AND gate matrix in combination with an OR gate matrix comprising:

first testing said read-only-memory addressing mode of said AND matrix and testing said OR matrix by individually addressing all of the OR gates of said OR gates matrix using the read-only-memory addressing mode of said AND matrix and monitoring the output of said OR matrix; and secondly testing said programmable-logic-array addressing mode of said AND matrix by individually addressing all of the programmable-logic-array AND gates of said AND matrix using the read-only-memory addressing mode in combination with the programmable-logic-array addressing mode of said AND matrix and monitoring the output of said OR matrix.

9. The method according to claim 8 wherein said first testing sequence includes using said read-only-memory addressing mode of said AND matrix to address individual rows of the OR matrix and sequentially reading the columns of the OR matrix for each addressed row.

10. A method of testing a logic array having a programmable-logic-array and a read-only-memory addressing mode AND gate matrix in combination with an OR gate matrix comprising:

first testing said read-only-memory addressing mode of said AND matrix and testing said OR matrix by individually addressing all of the OR gates of said OR gate matrix using the read-only-memory addressing mode of said AND matrix and monitoring the output of said OR matrix; and secondly testing said programmable-logic-array addressing mode of said AND matrix by individually addressing each AND gate in said AND matrix using a read-only-memory mode address and a programmable-logic-array mode address with DON'T CARE address lines of said programmable-logic-array mode addressing at a first logic state, and monitoring said OR matrix output and addressing the same AND gate using the same read-only-memory mode address and said programmable-logic-array mode address with said DON'T CARE address lines of said programmable-logic-array mode address at a second logic state complementary to said first logic state and monitoring said OR matrix output.

11. The method according to claim 35 wherein said second testing sequence further includes for each AND gate in said AND matrix;

complementing each CARE address line of the programmable-logic-array mode addressing one at a time; and monitoring said OR matrix output for each complemented address line.

12. The method according to claim 11 wherein said second testing sequence further includes for each AND gate in said AND matrix:

monitoring said OR matrix output of each addressed OR gate for each complemented CARE address line.

13. A method for testing a logic array having an OR gate matrix with a programmable-logic-array section and a read-only-memory section and an AND gate matrix having read-only-memory addressing mode and programmable-logic-array addressing mode comprising:

first testing said total OR matrix using said read-only-memory addressing mode of said AND matrix to individually address each row of said OR matrix and monitoring the output of all the sections of said OR matrix for each addressed row; and second testing said AND matrix using said read-only-memory and programmable-logic-array addressing modes of said AND matrix to individually address each AND gate in said AND matrix, and monitoring the output of said programmable-logic-array section of said OR matrix.

14. The method according to claim 13 wherein the output logic of said OR array is controlled to individually select the sections of the OR matrix to be monitored during said testing.

15. A method for testing a logic array having an OR gate matrix with a programmable-logic-array section and a read-only-memory section and an AND gate matrix having read-only-memory addressing mode and programmable-logic-array addressing mode comprising:

first testing said total OR matrix using said read-only-memory addressing mode of said AND matrix to individually address each row of said OR matrix and monitoring the output of all the sections of said OR matrix for each addressed row;

second testing said AND matrix by individually addressing each AND gate in said AND matrix using a read-only-memory mode addressing and a programmable-logic-array mode address with DON'T CARE address lines of said programmable-logic-array mode address at a first logic state, and monitoring the output of said programmable-logic-array section of said OR matrix and addressing the same AND gate using the same read-only-memory address and said programmable-logic-array mode address with said DON'T CARE address lines of said programmable-logic-array mode address at a second logic state complementary to said first logic state and monitoring the output of said programmable-memory-array section of said OR matrix.

16. The method according to claim 36 wherein said second testing sequence further includes for each AND gate in said AND matrix:

complementing each CARE address lines of the programmable-logic-array mode address one at a time; and monitoring the output of said programmable-logic-array section of said OR matrix for each complemented address line.

17. In a logic array having an AND gate matrix with a read-only-memory input means and a programmable-logic-array input means, an OR gate matrix connected to said AND gate matrix and having an output and control means for determining the addressing mode of said array, the improvement comprising:

said AND gate matrix having a plurality of AND gates corresponding to the number of AND gates required by said read-only-memory input means;

said programmable-logic-array input means including a first and second programmable-logic-array means having their inputs connected in parallel and their outputs connected to said plurality of AND gates required by said read-only-memory input means, the number of AND gate required for both said first and second programmable-logic-array input means exceeds said plurality of AND gates required for said read-only-memory input means;

said OR gate matrix having a plurality of inputs from said AND gate matrix corresponding to said plurality of AND gates and at least three groups of OR gates, a separate group each for said read-only-memory input means, said first programmable-logic-array input means and said second programmable-logic-array input means; and said control means being connected to said read-only-memory input means, said first and second programmable-logic-array input means and said output of said OR gate matrix to individually activate said input means and said OR gate output as a function of the addressing mode.

18. The logic array according to claim 17 wherein said control means enables one of said input means and corresponding group of OR gates.

19. The logic array according to claim 18 wherein said read-only-memory section of said OR gate matrix includes a plurality of groups of columns and said control means enables said plurality of groups of columns individually when enabling said read-only-memory input means.

20. The logic array according to claim 17 wherein said control means includes a test means for enabling said read-only-memory input means and sequencing through all of said groups of OR gates for each read-only-memory input means input.

21. The logic array according to claim 20 wherein said test means further includes simultaneously enabling said read-only-memory input means and one of said programmable-logic-array input means and a corresponding group of OR gates for said enabled programmable-logic-array input means.

22. The logic array according to claim 17 including next address means connecting to the output of said OR gate matrix and to said input means of said AND gate matrix for providing a next address to said AND gate matrix as a function of either or both the input word and the output of said OR gate matrix.

23. The logic array according to claim 22 wherein said control means includes test means for controlling said AND and OR gate matrixes and said next address means to address said AND gate matrix using test words.

24. The logic array according to claim 22 wherein said next address means further provides a next address to said AND gate matrix as a function computer status.

25. The logic array according to claim 37 including bypass means connecting an input of said programmable-logic-array input means to said output of said OR gate matrix for providing an output of said logic array which is a combination of said input and the output of said OR gate matrix.

26. The logic array according to claim 25 including means at the output of said OR gate matrix for controlling said bypass means as a function of the output of said OR gate matrix.

27. In a logic array having an input connected to an AND gate matrix with a read-only-memory addressing mode and a programmable-logic-array addressing mode, an OR gate matrix connected to said AND gate matrix and having an output, and control means for determining the addressing mode of said array, the improvement comprising:

latch means at the read-only-memory input to said AND gate array for maintaining an address at said read-only-memory input; and said control means operates said latch means during a test sequence for permitting addressing said AND gate matrix in both modes simultaneously.

28. The logic array according to claim 27 wherein said control means controls said output to sequence through columns of said OR gate matrix for a single address in said latch means.

29. The logic array according to claim 27 including next address means connected to the output of said OR gates matrix and to the input of said AND gate matrix for providing a next address to said AND gate matrix as a function of the input words, the output of said OR gate matrix, computer status and test words.

30. In a logic array having an input and an output, an AND gate matrix with a read-only-memory addressing mode and a programmable-logic-array addressing mode, an OR gate matrix connected to said AND gate matrix, and control means for determining the addressing mode of said array, the improvement comprising:

a bypass means connecting said input of said logic array to said output of said OR gate matrix for providing an output of said logic array which is a combination of the input of said logic array and the output of said OR gate matrix.

31. The logic array according to claim 30 wherein said bypass means further includes enabling means for controlling said bypass means as a function of the output of said OR gate matrix.

32. The logic array according to claim 30 including next address means connected to the output of said OR gate matrix and to the input of said AND gate matrix for providing a next address to said AND gate matrix as a function of the input words, the output of said OR gate matrix, computer status and test words.

* * * * *

UNITED STATES PATENT AND TRADEMARK OFFICE
CERTIFICATE OF CORRECTION

PATENT NO. : 4,461,000

DATED : July 17, 1984

INVENTOR(S) : William R. Young

It is certified that error appears in the above—identified patent and that said Letters Patent is hereby corrected as shown below:

IN THE ABSTRACT:

line 7, delete "the".

line 14, before "two" insert --PLA--.

line 15, delete "ROM" and insert --PLA--.

line 20, delete "gate" and insert "gates" and delete "microin-" and insert "macroin-".

Column 1, line 28, delete "inputed" and insert --inputted--.

Column 3, line 37, delete the comma after "macroinstruction" and insert a period.

Column 5, line 19, delete "of" and insert --to--.

Column 6, line 63, delete "107" and insert $-10^7-$; delete "224" and insert $-2^{24}-$.

Column 7, lines 4 and 5, delete "PLA-I INPUT ENABLE and a PLA-II INPUT ENABLE" and insert --$\overline{\text{PLA-I INPUT ENABLE}}$ and a $\overline{\text{PLA-II INPUT ENABLE}}$--.

line 9, delete "PLA-I ENABLE" and insert --$\overline{\text{PLA-I ENABLE}}$--.

lines 11 and 12, delete "PLA-II INPUT ENABLE" and insert --$\overline{\text{PLA-II INPUT ENABLE}}$--.

line 15, delete "icludes" and insert --include--.

UNITED STATES PATENT AND TRADEMARK OFFICE
CERTIFICATE OF CORRECTION

PATENT NO. : 4,461,000
DATED : July 17, 1984
INVENTOR(S) : William R. Young

It is certified that error appears in the above—identified patent and that said Letters Patent is hereby corrected as shown below:

Claim 6, line 8, delete "DONT'T" and insert --DON'T--.

Claim 7, line 1, delete "34" and insert --6--.

Claim 8, line 8, delete "gates" and insert --gate--.

Claim 11, line 1, delete "35" and insert --10--.

Claim 15, line 14, delete "addressing" and insert --address--.

Claim 16, line 1, delete "36" and insert --15--.

Claim 17, line 15, delete "gate" and insert --gates--.

Claim 22, line 2, delete "connecting" and insert --connected--.

Claim 24, line 2, after "said" insert --input means of said--.

Claim 25, line 1, delete "37" and insert --17--.

Claim 29, line 3, delete "gates" and insert --gate--.

Signed and Sealed this

Eighth Day of January 1985

[SEAL]

Attest:

Attesting Officer

GERALD J. MOSSINGHOFF

Commissioner of Patents and Trademarks